United States Patent
Burkholder et al.

(10) Patent No.: US 9,478,931 B2
(45) Date of Patent: Oct. 25, 2016

(54) METHOD FOR ACTIVELY CONTROLLING THE OPTICAL OUTPUT OF A SEED LASER

(71) Applicant: nLight Photonics Corporation, Vancouver, WA (US)

(72) Inventors: Gary L. Burkholder, Camas, WA (US); Michael C. Nelson, Vancouver, WA (US); Michael Brinker, Seattle, WA (US)

(73) Assignee: nLight Photonics Corporation, Vancouver, WA (US)

(*) Notice: Subject to any disclaimer, the term of this patent is extended or adjusted under 35 U.S.C. 154(b) by 0 days.

(21) Appl. No.: 13/758,904

(22) Filed: Feb. 4, 2013

(65) Prior Publication Data

US 2014/0219299 A1 Aug. 7, 2014

(51) Int. Cl.

| H01S 3/102 | (2006.01) |
|---|---|
| H01S 3/091 | (2006.01) |
| H01S 3/094 | (2006.01) |
| H01S 3/131 | (2006.01) |
| H01S 3/06 | (2006.01) |
| H01S 3/067 | (2006.01) |
| H01S 3/113 | (2006.01) |
| H01S 5/042 | (2006.01) |
| H01S 3/13 | (2006.01) |

(52) U.S. Cl.
CPC ......... *H01S 3/1024* (2013.01); *H01S 3/09408* (2013.01); *H01S 3/1312* (2013.01); *H01S 3/1317* (2013.01); *H01S 3/0627* (2013.01); *H01S 3/06754* (2013.01); *H01S 3/113* (2013.01); *H01S 3/1301* (2013.01); *H01S 5/042* (2013.01)

(58) Field of Classification Search
CPC .. H01S 3/042; H01S 3/06754; H01S 3/0627; H01S 3/0912; H01S 3/094076; H01S 3/1305; H01S 3/1312; H01S 3/1317

USPC .......................................................... 372/25
See application file for complete search history.

(56) References Cited

U.S. PATENT DOCUMENTS

| 4,166,985 | A | * | 9/1979 | White et al. ................. 372/30 |
|---|---|---|---|---|
| 4,264,870 | A | | 4/1981 | Avicola |
| 4,503,403 | A | | 3/1985 | Taylor et al. |
| 4,608,697 | A | | 8/1986 | Coldren |
| 4,635,246 | A | | 1/1987 | Taylor et al. |
| 4,866,720 | A | * | 9/1989 | Holly .............................. 372/23 |
| 5,778,015 | A | | 7/1998 | Gunning et al. |
| 5,778,016 | A | | 7/1998 | Sucha et al. |
| 5,987,042 | A | * | 11/1999 | Staver et al. ................. 372/30 |
| 6,208,672 | B1 | | 3/2001 | Gunning et al. |

(Continued)

OTHER PUBLICATIONS

Koechner, *Solid State Laser Engineering*, 6$^{th}$ edition, pp. 268-270 (2006).

(Continued)

*Primary Examiner* — Yuanda Zhang
*Assistant Examiner* — Michael Carter
(74) *Attorney, Agent, or Firm* — Klarquist Sparkman, LLP

(57) ABSTRACT

Seed pulse generators for fiber amplifier systems include a seed pump controller coupled to a seed pump laser diode. A photodetector is situated to detect seed pulse generation, and is coupled to the seed pump controller so that seed pumping is decreased upon pulse detection. For a laser diode pump source, a pump current can be pulsed to produce a seed pulse and then decreased to a bias level such as a DC bias current that is less than a pump laser threshold current. Single seed pulses can be generated with reduced pulse jitter.

24 Claims, 7 Drawing Sheets

(56) References Cited

U.S. PATENT DOCUMENTS

| | | | |
|---|---|---|---|
| 6,243,195 B1* | 6/2001 | Pedersen et al. ................. | 398/9 |
| 6,590,922 B2 | 7/2003 | Onkels et al. | |
| 6,661,820 B1* | 12/2003 | Camilleri et al. ......... | 372/38.09 |
| 7,324,788 B2 | 1/2008 | Ramet et al. | |
| 7,391,794 B2 | 6/2008 | Kane | |
| 7,582,848 B2 | 9/2009 | Smart | |
| 7,608,808 B2 | 10/2009 | Kuramoto | |
| 7,964,819 B2 | 6/2011 | Bruland | |
| 8,160,113 B2 | 4/2012 | Adams et al. | |
| 8,254,419 B1 | 8/2012 | Savage-Leuchs et al. | |
| 8,532,151 B2* | 9/2013 | Li et al. ......................... | 372/11 |
| 2002/0097761 A1 | 7/2002 | Sucha et al. | |
| 2002/0114370 A1 | 8/2002 | Onkels et al. | |
| 2002/0196823 A1 | 12/2002 | Nakao et al. | |
| 2003/0197918 A1 | 10/2003 | Ng et al. | |
| 2003/0202168 A1* | 10/2003 | Barenz et al. ............... | 356/4.01 |
| 2004/0190119 A1 | 9/2004 | Tauser et al. | |
| 2007/0064747 A1* | 3/2007 | Feve et al. ...................... | 372/10 |
| 2007/0223544 A1* | 9/2007 | Yamazaki et al. ....... | 372/29.014 |
| 2007/0268940 A1 | 11/2007 | Luo et al. | |
| 2008/0089369 A1 | 4/2008 | Luo et al. | |
| 2009/0046746 A1 | 2/2009 | Munroe et al. | |
| 2009/0296755 A1 | 12/2009 | Brown et al. | |
| 2010/0038558 A1* | 2/2010 | Yamazoe ................. | 250/458.1 |
| 2010/0189136 A1 | 7/2010 | Gapontsev et al. | |
| 2010/0189141 A1 | 7/2010 | Zhang et al. | |
| 2011/0062127 A1 | 3/2011 | Gu et al. | |
| 2011/0085576 A1* | 4/2011 | Crawford et al. ......... | 372/38.07 |
| 2011/0122912 A1 | 5/2011 | Benjamin et al. | |
| 2011/0142084 A1 | 6/2011 | Reid et al. | |
| 2012/0087386 A1 | 4/2012 | Brown et al. | |
| 2012/0242973 A1 | 9/2012 | Tünnermann et al. | |
| 2013/0114627 A1* | 5/2013 | Filgas et al. ................... | 372/11 |

OTHER PUBLICATIONS

Seo et al., "Timing jitter reduction of gain-switched DFB laser by external injection-seeding," Elec. Lett. 32(1): pp. 44-45 (1996).

Johann Nilsson, "High-power fiber lasers: Surge to power," SRC Annual Meeting, Sep. 19-21, pp. 21-23, (2005).

International Search Report and Written Opinion from International Application No. PCT/US2014/027709, dated Sep. 12, 2014, 10 pages.

Office action dated Feb. 4, 2014, from U.S. Appl. No. 13/835,354, 15 pages.

Final Office action dated Jul. 17, 2014, from U.S. Appl. No. 13/835,354, 18 pages.

Margalit et al., "Injection locking of an actively mode-locked semiconductor laser," Optics Letters, 19(24): 2125-2127 (Dec. 15, 1994).

Office action dated Dec. 26, 2014, from U.S. Appl. No. 13/835,354, 20 pages.

Chinese Office Action dated May 30, 2016, from Chinese Patent Application No. 201410044843.1 with English-language Translation.

* cited by examiner

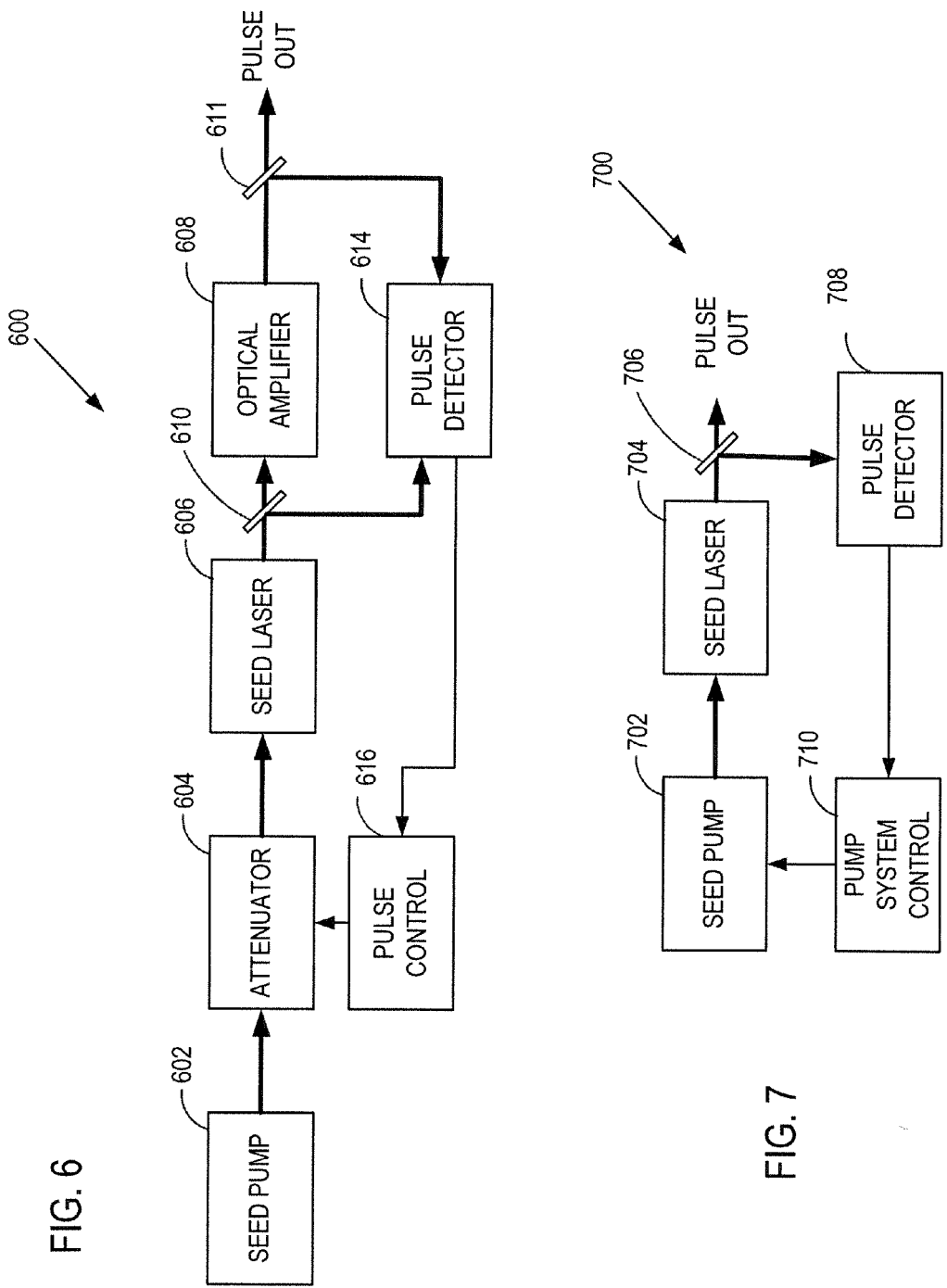

METHOD FOR ACTIVELY CONTROLLING THE OPTICAL OUTPUT OF A SEED LASER

FIELD

The disclosure pertains to laser pulse control for seed lasers.

BACKGROUND

In many laser applications, stable laser pulses are required. In some cases, control of pulse-to-pulse timing is important, while in others, variations in pulse energy or pulse duration can be unacceptable. In addition, some laser systems can be configured to provide repeatable laser pulses in a narrow range of pulse repetition rates, so that applications that require variable pulse repetition rates typically require several sources. In some processing applications, unstable pulse outputs appear as missing pulses or double pulses and both are undesirable. Methods and apparatus that provide stable laser pulses over a wide range of repetition rates are described below.

SUMMARY

As disclosed herein, seed pulse sources reliably provide single pulses to optical amplifiers for amplification. Amplified single pulses can then be used in various materials processing applications without adverse effects introduced by undesired multiple pulses. In some examples, optical pulse generation systems comprise a seed laser that includes a seed laser pump and a seed laser gain medium. An optical amplifier is situated to receive at least one seed pulse from the seed laser and produce an output pulse corresponding to an amplified seed pulse. A seed laser controller is coupled to the seed laser pump and configured to reduce pumping of the seed laser gain medium in response to detection of an output pulse associated with the seed laser pulse. In some examples, a photodetector is coupled to receive at least a portion of the output pulse, wherein the detection of the output pulse is based on a photodetector signal associated with the received portion of the output pulse. In further examples, the portion of the output pulse received by the photodetector is a portion of the seed pulse or a portion of the amplified seed pulse. In representative examples, the optical amplifier is a fiber amplifier and the seed pump includes one or more laser diodes. In typical examples, the seed laser controller is configured to establish a pulsed current for the seed pump laser diode and to reduce a magnitude of the pulse current in response to the detection of an output pulse associated with the seed laser pulse. In other embodiments, the seed laser controller is configured to terminate the pulse current in response to the detection of an output pulse associated with the seed laser pulse. In further representative examples, the seed laser controller is configured to establish an amplified seed pulse repetition rate by periodically applying a pulse bias current to a seed pump laser diode.

According to representative examples, methods of generating seed pulses comprise detecting an optical pulse associated with a seed laser, and reducing pumping of the seed laser gain medium in response to the detected pulse. In some embodiments, the seed laser is pumped with a laser diode, and the pumping of the seed laser gain medium is reduced by decreasing a current applied to the laser diode. In other examples, the seed laser is pumped with a plurality of laser diodes, and the pumping of the seed laser gain medium is reduced by decreasing a current applied to at least one of the plurality of laser diodes. In some embodiments, generation of the optical pulse is initiated by applying a pulse current to at least one of the plurality of laser diodes, wherein the pulse current is decreased in response to the detected pulse. In typical examples, the pulse current is greater than a laser diode threshold current for at least one of the plurality of laser diodes and a bias current is applied to at least one of the plurality of laser diodes, wherein the bias current is less than a pump laser threshold. Typically, the bias current is a DC bias current.

Optical seed pulse sources comprise a pump source configured to pump a solid state gain medium to produce optical gain in the solid state gain medium. A pump source controller is configured to adjust pumping by the pump source in response to detection of a seed pulse produced by the solid state gain medium. In some examples, a photodetector is coupled to the pump source controller and configured to detect the seed pulse. In some embodiments, the pump source is a laser diode and the pump source controller is configured to adjust pumping based on current applied to the laser diode. In still additional examples, a solid state gain medium to be pumped is situated in an optical resonator.

These and other features of the disclosed technology will become more apparent from the following detailed description, which proceeds with reference to the accompanying figures.

BRIEF DESCRIPTION OF THE DRAWINGS

FIG. 6 illustrates an apparatus for generating seed pulses that is configured to attenuate pump radiation to the seed laser.

FIG. 7 illustrates a system that controls a seed pump based on whether or not a seed pulse is detected.

DETAILED DESCRIPTION

Figure 1:
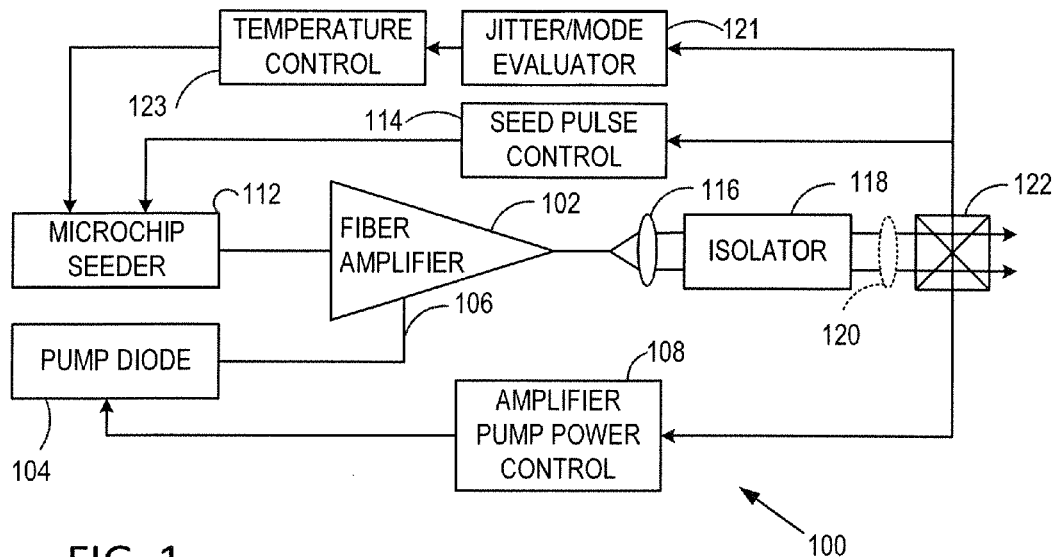
FIG. 1 illustrates a laser system configured to amplify a seed laser pulse in a fiber amplifier.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In the following examples, optical signals and beams refer to propagating electromagnetic radiation at wavelengths between about 50 nm and 10 μm, but other wavelengths can be used. In some examples, wavelengths associated with laser diode pump lasers (between about 500 nm and 1.1 μm) and doped fiber amplifiers (between about 1 μm and 1.7 μm are used. The term optical amplifier refers to a medium that can produce optical gain in response to suitable pumping. An optical amplifier can be situated in a laser cavity or other resonator so as to form a laser oscillator.

In some examples, beam splitters or other optical elements are used to obtain portions of seed beams or amplified seed beams. In other examples, fiber couplers, splitters, circulators, or other fiber or bulk optical components or combinations thereof can be used. Pulse generation can be detected prior to or after amplification as may be convenient.

Seed lasers can provide seed pulses at repetition rates from 1 Hz or less to 100 MHz or more. At low repetition rates, i.e., repetition rates that are less that $1/T_{gain}$, wherein $T_{gain}$ is a decay time associated with seed laser gain such as a so-called $T_1$ or $T_2$ time, residual gain after generation of a seed pulse is typically well attenuated between pulses. At such repetition rates, second (generally undesirable) pulses can result if the seed laser continues to be pumped. At high repetition rates, excess gain is not substantially reduced by spontaneous decay between pulses, and excess gain can accumulate to produce double pulsing. However, if adequate gain is not produced in the seed laser, seed pulses may not be generated. Control of seed laser pumping can be used to avoid or reduce the frequency of double pulses or missing pulses. In addition, pulse controllers may be configured to operate somewhat differently for different pulse repetition rates, and generally to more accurately terminate or attenuate seed laser pumping at high repetition rates. Control of excess gain also tends to decrease pulse to pulse jitter, likely because each pulse is produced based on seed pulses produced from substantially the same seed laser pumping.

With pulse detection based pumping reduction shown in some examples below, seed laser gain is relatively high in response to a pulse bias so that a seed pulse is promptly generated, and subsequent reductions in pumping to a DC bias or other lower level eliminate or reduce the likelihood of subsequent unwanted pulses. For laser diode pump sources, the DC bias is typically below a lasing threshold, and is selected to aid in rapid modulation upon application of a pulsed current. Representative examples are set forth below for convenient illustration.

FIG. 1 illustrates an optical pulse system 100 that includes a pump laser 104 (typically a laser diode) that is coupled to provide a pump beam to a fiber amplifier 102 via one or more pump fibers 106. One or more pump lasers can be provided, and one or more pump beams can be combined in one or more pump fibers. The fiber amplifier 102 is generally a length of an actively doped optical fiber such as ytterbium (Yb) or erbium (Er) doped fibers. In other examples, an optical amplifier based on a doped laser material such as a doped crystal, a doped glass rod, or a solid state or other gain material can be used. Pump beams are conveniently combined in a fiber combiner that includes one or more fibers coupled to receive respective pump beams. The pump beams can be arranged to co-pump, counter-pump, or co- and counter-pump the fiber amplifier 102 or other gain materials. In other examples, the fiber amplifier 102 can be pumped with pump beams coupled with free space optical systems, or a combination of pump fibers and free space optical systems.

As shown in FIG. 1, a microchip seed laser 112 is coupled to deliver a seed pulse to the fiber amplifier 102, and a seed pulse controller 114 is coupled to the microchip seed laser 112 to select seed pulse repetition rates, timings, and pulse energies. The microchip laser 112 can include a section of a solid-state gain material placed between two plane-parallel dielectric mirrors and one or more laser diode pump lasers. The solid-state gain material is selected so that microchip laser pulses are at wavelengths corresponding to a gain bandwidth of the fiber amplifier 102 so that a microchip laser pulse is amplified in the fiber amplifier 102. The microchip laser 112 also typically includes a saturable absorber, and the microchip laser produces Q-switched pulses in a single microchip cavity mode. However, other seed pulse sources can be used, as may be convenient. In some examples, a pump beam combiner used to pump the fiber amplifier 102 also includes a central or other selected fiber (a signal fiber) configured to receive the microchip laser seed pulses and direct these pulses to the fiber amplifier 102.

Amplified seed pulses from the fiber amplifier 102 are received by a beam shaping lens 116 or other beam shaping optics and directed to an optical isolator 118 so as to produce an output beam 120 that is directed to one or more beam splitters 122 so as to direct portions of the output beam 120 to an amplifier pump power controller 108 and a seed pulse controller 114. The amplifier pump power controller 108 is configured to determine drive currents for the pump diode (or diodes) 104, as well as to establish timing for initiating and terminating pump laser drive currents, and to specify transitions between drive levels. In addition, the amplifier pump power controller 108 can adjust laser diode drive currents to compensate for diode aging or failure of one or more pump diodes.

The seed pulse control 114 is configured to establish drive currents for pump lasers of the microchip laser 112. Typically, the seed pulse controller 114 establishes one or more current pulses at a selected repetition rate, and a constant bias current, but a variety of drive configurations can be used. Laser diode pump sources are generally driven based on current levels, but combinations of current and voltage levels can be used, and other pump sources can be used and controlled as appropriate.

A temperature controller 123 can also be coupled to the seed laser 112. A portion of the amplified seed pulse can be coupled to a pulse jitter or pulse mode evaluator 121, and seed laser temperature adjusted to reduce, increase, or otherwise select desired pulse jitter. With pulse output stabilized by control of seed laser pumping, pulse jitter can be substantially reduced, typically by factors of about 2-5 in comparison with unstabilized seed pumping. Typically, a seed laser temperature is selected to obtain a selected (e.g., minimum jitter) based on measured jitter or a preferred mode configuration. In typical examples, microchip laser temperatures are controlled to about 1 C, whereas conventional systems require temperature control to about 0.01 C. Thus, for a selected repetition rate, temperature variations of about 1 C are permitted. Pulse stabilization also permits simpler control of pump laser currents. With conventional systems, pulse laser currents are controlled to within about 10 mA, but with pulse stabilization, current control to within about 100 mA is suitable.

Figure 2:
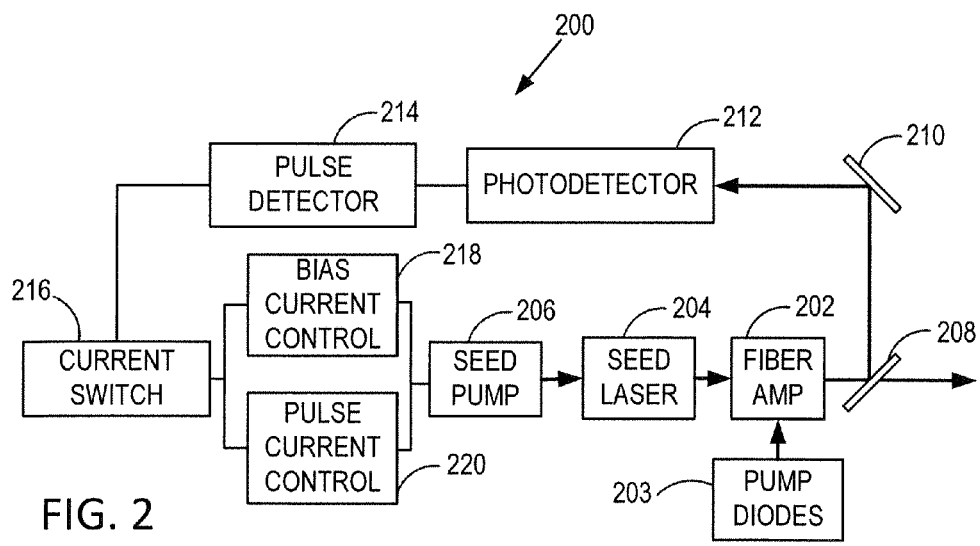
FIG. 2 illustrates a seed pump control system configured to selectively set a laser diode pump current to a bias current or a pulsed pump current.

FIG. 2 illustrates a seed pulse controller 200 configured to pump a microchip laser so as to repeatably produce single pulse outputs over a large range of pulse repetition rates. As shown in FIG. 2, a fiber amplifier 202 is coupled to receive seed laser pulses from a seed laser 204 that is pumped by a seed pump laser 206. The fiber amplifier 202 is also coupled to one or more pump lasers 203. An amplified seed pulse is provided as an output, and a portion of the amplified pulse output is directed by a beam splitter 208 and a reflector 210 to a photodetector 212. In some examples, fiber couplers are used to direct beam portions to the photodetector 212. A photodetector signal responsive to the amplifier pulse output is amplified or buffered and coupled to a pulse detector 214. The pulse detector 214 determines whether or not an amplifier pulse has been received, and couples a corresponding pulse notification signal to a current switch 216. The current switch 216 is coupled so as to enable a bias current control 218 or a pulse current control 220 to establish a drive current for the seed pump 206. If an amplified pulse is detected, the bias current control 218 provides a bias current to the seed pump laser 206 and the pulse current control 220 terminates a pulsed drive current. The bias current control 218 typically provides a constant bias current that is about 5%, 10%, 20%, 25%, 40%, 50%, 75%, or 90% of a pump laser threshold value. The pulse current control 220 typically provides a drive current that is a factor of 1, 2, 4, 5, 10, 20 or more times a pump laser threshold current, and can be selected to be a current level that avoids pump laser damage. The pulse current control 220 can also establish a maximum pulse duration, but such a duration can be provided by the current switch 216 as well.

Figure 3A:
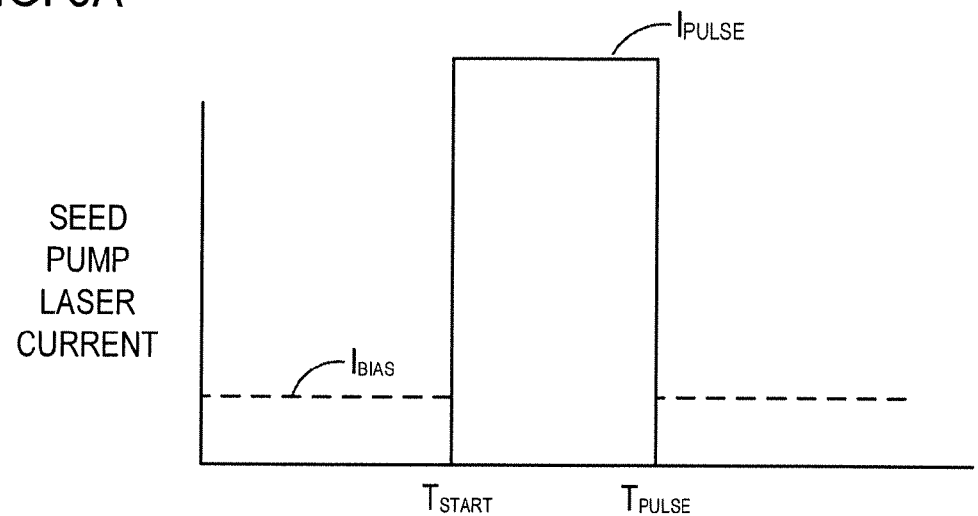
FIGS. 3A-3B illustrate representative seed pump laser drive currents.
Figure 3B:
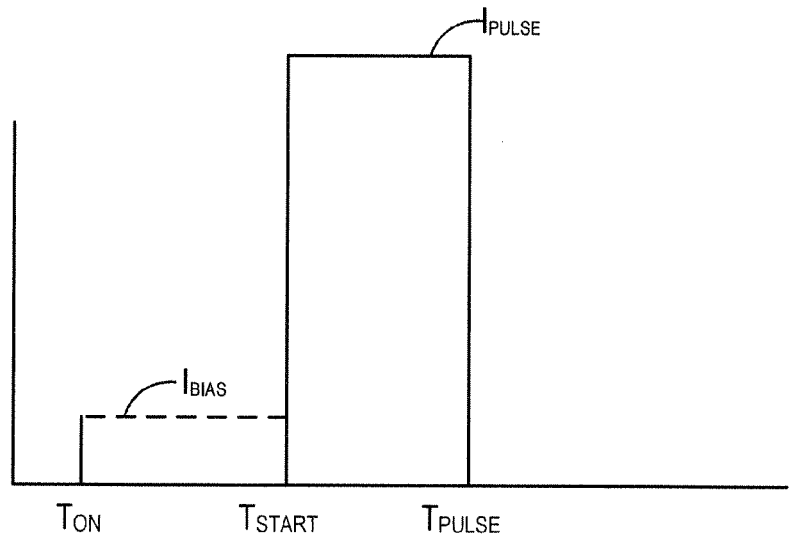

FIGS. 3A-3B illustrate representative seed pump laser drive currents. Current transitions shown in FIGS. 3A-3B are schematic, and actual implementations exhibit finite rise times, fall times, and switching times. As shown in FIG. 3A, a laser current $I_{BIAS}$ is established while awaiting initiation of seed pulse generation. At a time $T_{START}$, seed laser pulse generation is initiated by providing a pulsed current $I_{PULSE}$ that is generally substantially greater than $I_{BIAS}$. The DC bias current $I_{BIAS}$ can continue or be terminated. At time $T_{PULSE}$, a seed pulse is detected by the pulse detector 214, and the pulsed current is switched off and the bias current $I_{BIAS}$ switched on. In the example of FIG. 3B, a bias current $I_{BIAS}$ is applied at time $T_{ON}$ and a pulsed bias applied at $T_{START}$. After a seed pulse is detected at time $T_{PULSE}$, drive current returns to zero until a subsequent pulse is requested. In other examples, the bias current can be pulsed, multi-level or otherwise selected so as to permit rapid pulse formation upon application of $I_{PULSE}$.

Figure 4:
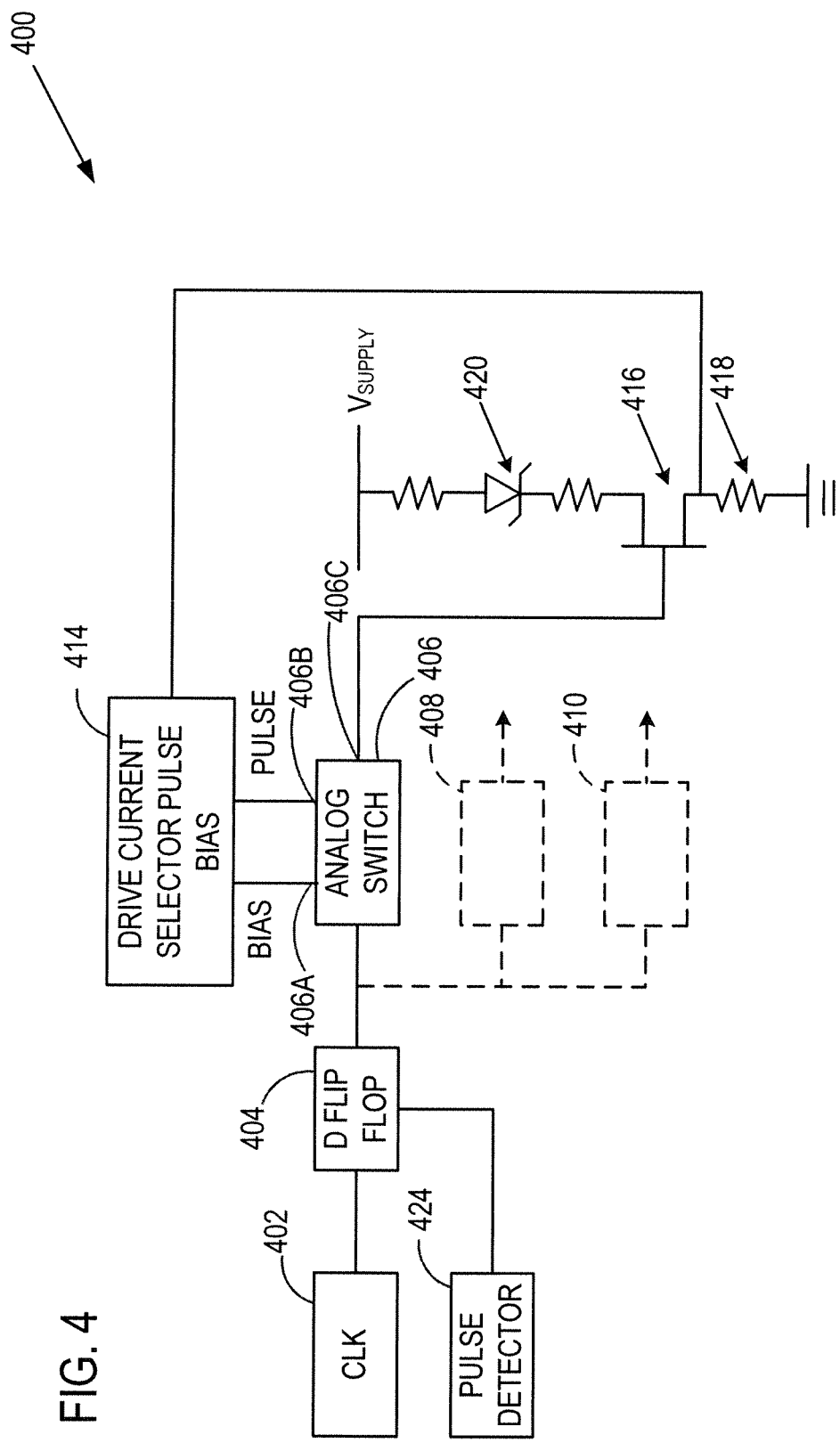
FIG. 4 illustrates a representative method of obtaining single laser pulses at a selected pulse repetition rate (PRR).

Referring to FIG. 4, a representative seed pump driver 400 includes a clock generator 402 that provides clock pulses or other signals that define a seed pulse repetition rate. The clock generator 402 is coupled to a D-flip flop 404 that is in turn coupled to an analog switch 406 that is in communication with a pump drive current controller 414. The D-flip flop 404 is configured to initiate switching of the analog switch 406 so as to switch a seed pump drive current from a bias current source coupled to an analog switch input 406A to a pulse current established by a pulse current source coupled to an analog switch input 406B.

In the example of FIG. 4, an analog switch output 406C is coupled to a gate of a FET 416 that is coupled so as to drive a pump laser 420 at a drive current based on the output of the analog switch 406. A sense resistor 418 is provided for measurement of laser drive current and is coupled to the pump drive controller 414 so that pulse and bias drive currents can be sensed to provide feedback-based drive current control. A pulse detector 424 is coupled to a photodetector (not shown in FIG. 4) and the D-flip flop 404 so as to trigger the D-flip flop 404 so that the pump laser current decreases from the pulse current to the bias current. Additional pump lasers can be similarly controlled with respective analog switches 408, 410, but additional circuitry for such pump lasers is not shown in FIG. 4. In some examples, arrays of laser diodes are used as seed pumps, but for convenient illustration, only the single laser diode 420 is shown in FIG. 4.

Figure 5:
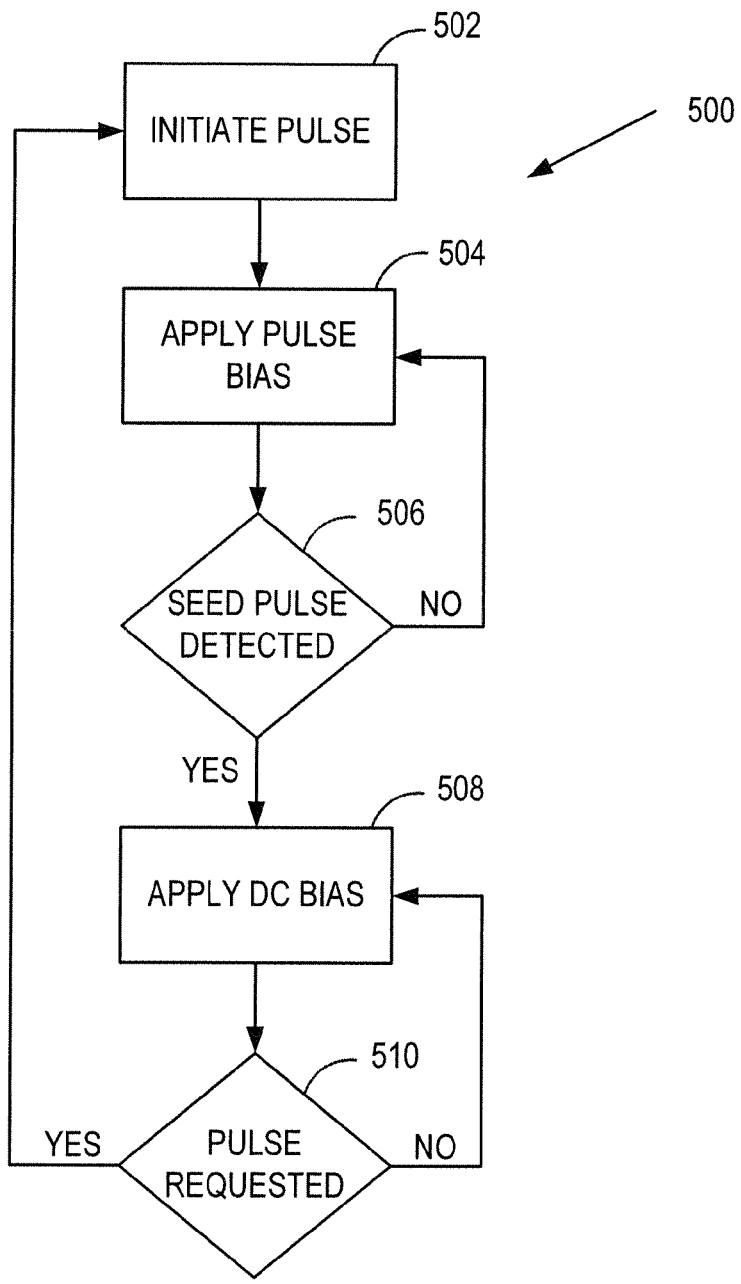
FIG. 5 illustrates a representative method of generating seed pulses.

FIG. 5 illustrates a representative method 500 of generating single seed pulses. At 502, generation of a seed pulse is initiated based on, for example, a clock signal that is adjustable by a user to provide pulses at a suitable repetition rate. At 504, a pulse bias is applied to one or more pump lasers so as to excite the pump lasers to be above a laser threshold. At 506, an amplified seed pulse or a seed pulse can be detected. If no seed pulse (or other suitable pulse) is detected, the pulse bias continues to be applied at 504. If a seed pulse is detected, the pulse bias is discontinued and a DC bias is applied at 508. As noted above, a DC bias after pulse generation is not required, and a prebias can be applied prior to a pulse bias, if desired. At 510, requests (i.e., clock signals) are detected to determine if another seed pulse is to be generated. If so, a pulse is initiated at 502. Otherwise, DC bias continues to be applied at 508.

With reference to FIG. 6, a representative seed pulse generator 600 includes a seed pump source 602 such as one or more laser diodes or other optical sources. The seed pump provides a seed pump optical beam to an optical attenuator 604 that couples the seed pump optical beam to a seed laser 606. In response to the seed pump optical beam, the seed laser 606 produces an optical beam, typically a single, isolated optical pulse that is directed to an optical amplifier 608 through a beam splitter 610. The amplified optical beam from the optical amplifier 608 is directed through an output beam splitter 611. Portions of either the un-amplified or amplified optical beam from the seed laser 606 are directed by one or both of the beam splitters 610, 611 to a pulse detector 614 that is coupled to a pulse controller 616. The pulse controller 616 initiates a change in optical attenuation at the optical attenuator 604 based on detection of an amplified optical pulse or other selected optical signal or signals at one or both of the beam splitters 610, 611. In order to provide rapid attenuation modulation, the optical attenuator 604 can be a bulk or waveguide electro-optic or an acousto-optic device. In addition, the seed pump 602 can be modulated to vary an amplitude, frequency, or other seed pump characteristic so as to change a rate at which the seed laser gain medium is pumped. The pulse controller 616 can also be used to establish a pulse repetition rate.

FIG. 7 illustrates a representative seed pulse source 700 that includes a seed laser 704 that is coupled to a pump source 702. A beam splitter 706 is situated to direct a portion of a seed laser output to a pulse detector 708. The pulse detector 708 is coupled to a pump controller 710 that modulates pump power provided by the seed pump 702 according to a signal from the pulse detector 708. The seed pump can be an optical, electrical, or other pump source as is appropriate for the seed laser 704.

Figure 8:
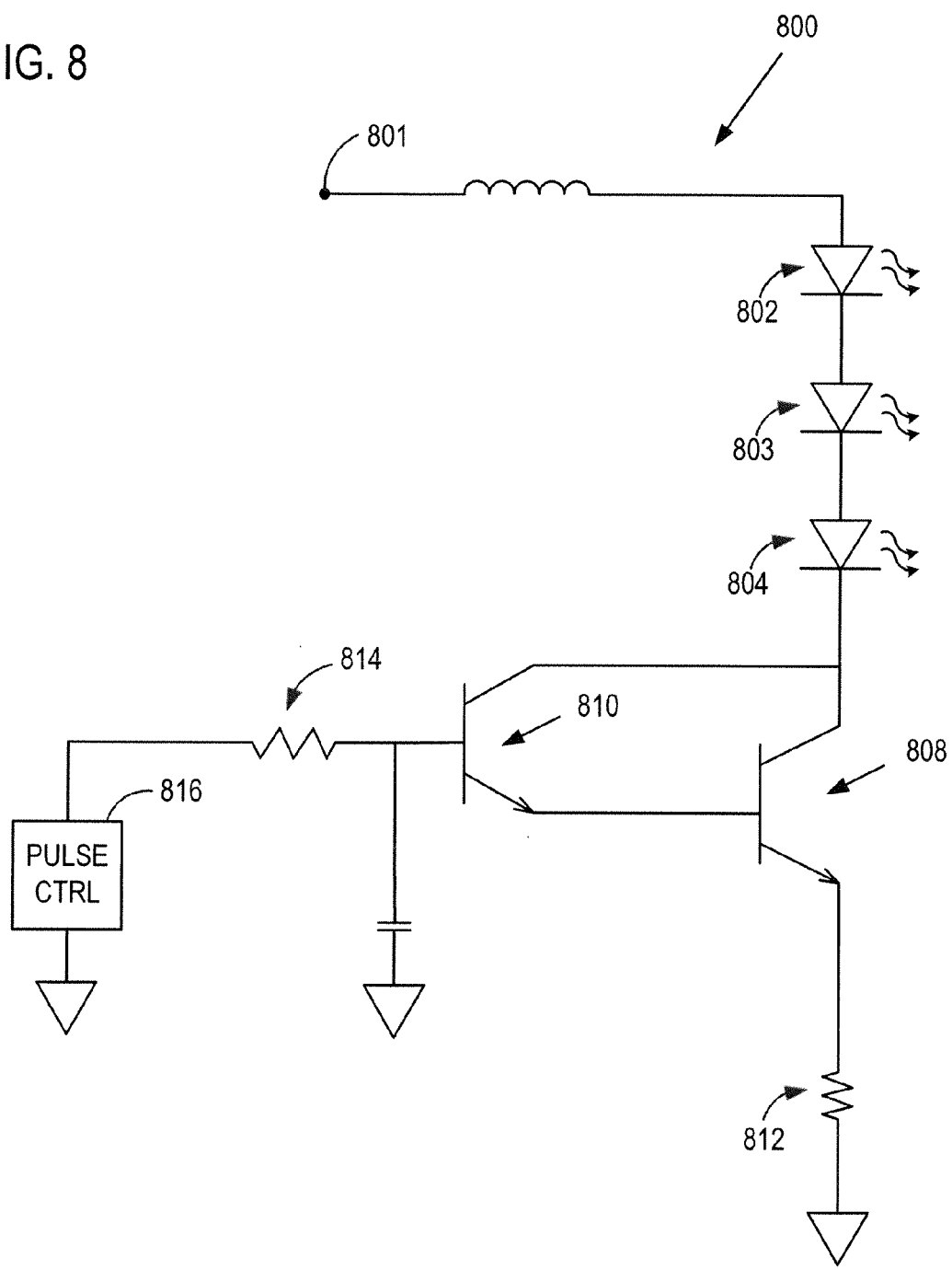
FIG. 8 illustrates an alternative circuit arrangement for controlling pump lasers.

Referring to FIG. 8, a pump laser system 800 for pumping a seed laser includes pump laser diodes 802-804 that are coupled to a bipolar transistor pair comprising transistors 808, 810. A pulse controller 816 is coupled to a base of the transistor 810 with a resistor 814 so as to control current in the laser diodes 802-804. A laser diode drive voltage can be applied at 801. A sense resistor 812 is provided for measurement of laser diode current.

Figure 10:
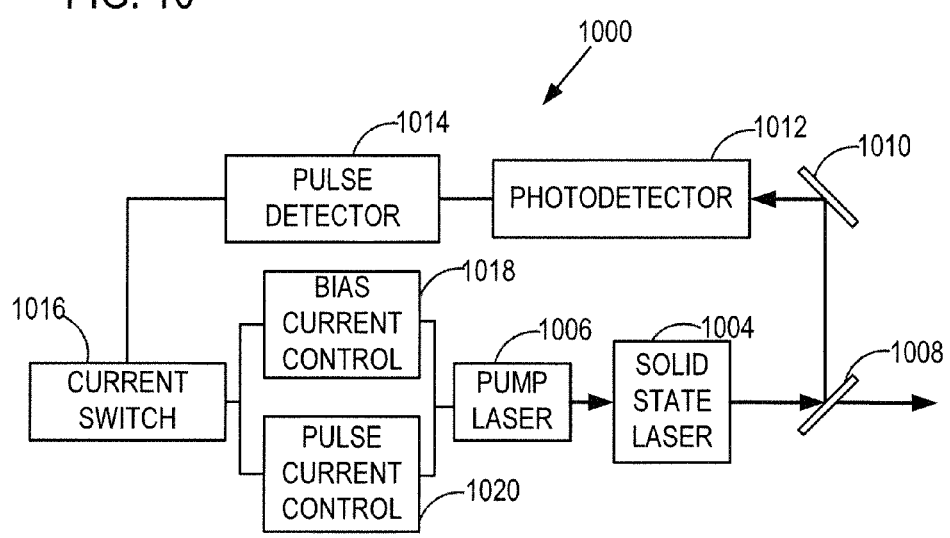
FIG. 10 is a block diagram of a laser system in which a pump laser is controlled based on an output from a solid state laser.

Referring to FIG. 10, a solid state laser 1004 is situated to receive a pump beam from a pump laser 1006. Reflectors 1008, 1010 are configured to couple an output beam (such as one or more pulses) from the solid state laser 1004 to photodetector 1012. A photodetector signal responsive to the solid state laser output is amplified or buffered and coupled to a pulse detector 1014 that determines whether or not a pulse has been received, and couples a corresponding pulse notification signal to a current switch 1016. The current switch 1016 is coupled so as to enable a bias current control 1018 or a pulse current control 1020 to establish a drive current for the pump laser 1006. If an amplified pulse is detected, the bias current control 1018 provides a bias current to the pump laser 1006 and the pulse current control 1020 terminates a pulsed drive current. In the example of FIG. 10, the pump laser is conveniently one or more diode lasers, but other pump sources can be used. In addition, pumping of gain media other than solid state media can be similarly controlled, and lasers other than solid state lasers can be similarly pumped.

Figure 9:
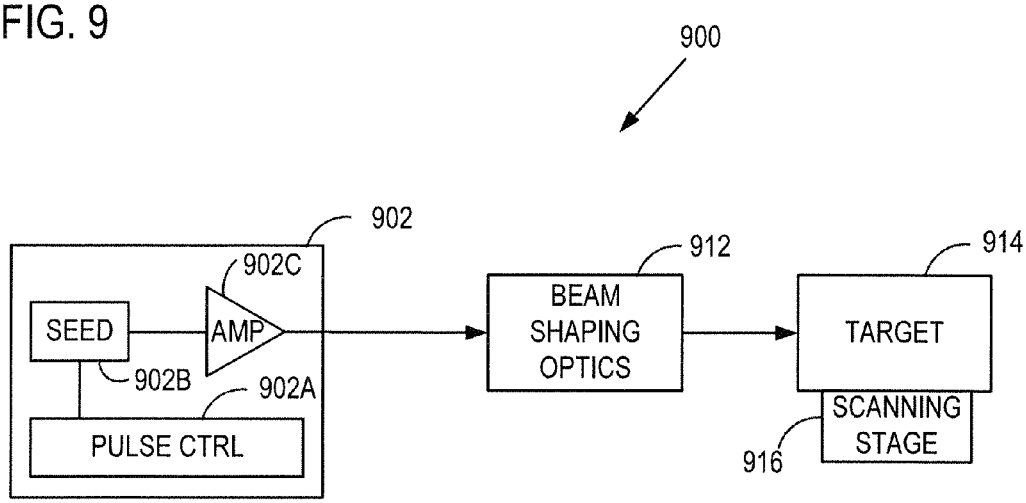
FIG. 9 is a block diagram of a materials processing system that includes a pump laser controlled seed pump source.

FIG. 9 is a block diagram of a representative materials processing system 900 that includes an optical pulse source 902 that includes a pump laser pulse controller 902A, a seed laser 902B, and an optical amplifier 902C. Optical pulses from the optical pulse source 902 are processed by a beam shaping optical system 912 to form a pulsed optical beam that is delivered to a target 914. A scanning stage 916 is configured to translate the target 914 so as to scan the pulsed optical beam over a surface of the target 914. Alternatively, one or all of the target 914, the optical pulse source 902, and the beam shaping optical system 912 can be translated for beam scanning. Typically, scanning is at a rate such that sequential pulses are adjacent or overlap somewhat at the target 914. With conventional pulse sources, some pulses are typically missing. Such missing pulses would cause associated areas of the target 914 to remain unprocessed.

It will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implement in a single hardware or software module, or separate modules can be provided. The particular arrangements above are provided for convenient illustration, and other arrangements can be used.

For example, one or more seed pump lasers can be used, and termination or reduction of pumping by one or more of these seed pump lasers can be used to generate single seed pulses. For example, for a seed laser that is pumped by a plurality of laser diodes, a pulsed current used to stimulate pulse generation can be terminated or reduced in one or more laser diodes of the plurality of laser diodes. Each of these laser diodes can be provided with different selected pulsed currents and bias currents with individualized time dependences. While it is generally convenient to reduce seed laser pumping by reducing laser diode drive currents, modulation of pump laser wavelength or polarization can also be used in some examples to allow optical gain in the seed laser gain medium to decrease. Pumping reductions are generally selected so that any additional pumping subsequent to pulse generation is insufficient to permit formation of another pulse. In some examples, pump radiation can be attenuated, and pump sources other than lasers (such as electrically or otherwise pumped optical amplifiers) can be similarly modulated to reduce amplifier gain upon emission of a selected pulse or pulses. In the above examples, seed lasers are shown as directing seed pulses to optical amplifiers, but such seed pulses can be directed to laser oscillators as well.

In view of the many possible embodiments to which the principles of the disclosure may be applied, it should be recognized that the illustrated embodiments are examples only and should not be taken as limiting the scope of the disclosure. We claim as all subject matter that comes within the scope and spirit of the appended claims.

We claim:

1. An apparatus, comprising:
a seed laser that includes a seed laser pump and a seed laser gain medium;
an optical amplifier situated to receive at least one seed pulse from the seed laser and produce an output pulse corresponding to an amplified seed pulse;
a clock circuit that provides a periodic clock signal; and
a seed laser controller coupled to the seed laser pump and the clock circuit, wherein the seed laser controller periodically establishes a pump laser sequence at a repetition rate greater than $1/T_{gain}$ where $T_{gain}$ is a decay time associated with seed laser gain, the pump laser sequence comprising a pump bias followed by a pump pulse in response to the periodic clock signal and reduces pumping of the seed laser gain medium by terminating the pump pulse in response to detection of an output pulse associated with the seed laser pulse to reduce a maximum pulse duration of the pump pulse so as to inhibit production of a subsequent seed laser optical pulse associated with the pump pulse.

2. The apparatus of claim 1, further comprising a photodetector coupled to receive at least a portion of the output pulse, wherein the detection of the output pulse is based on a photodetector signal associated with the received portion of the output pulse.

3. The apparatus of claim 2, wherein the portion of the output pulse received by the photodetector is a portion of the seed pulse.

4. The apparatus of claim 2, wherein the portion of the output pulse received by the photodetector is a portion of the amplified seed pulse.

5. The apparatus of claim 1, wherein the optical amplifier is a fiber amplifier.

6. The apparatus of claim 5, wherein the seed pump includes a laser diode.

7. The apparatus of claim 6, wherein the pump pulse is a pulsed current for the seed pump laser diode.

8. A method, comprising:
 establishing an initial pumping of a seed laser gain medium;
 applying a plurality of pump pulses to a pump laser that is coupled to the seed laser gain medium at a repetition rate greater than $1/T_{gain}$ where $T_{gain}$ is a deca time associated with seed laser gain;
 detecting a seed laser optical pulse associated with each pump pulse; and
 in response to the detected seed laser optical pulse, terminating the pump pulse so as to inhibit production of a subsequent seed laser optical pulse associated with the pump pulse.

9. The method of claim 8, wherein the seed laser is pumped with a laser diode, and, wherein each pump pulse is a current pulse.

10. The method of claim 8, wherein the seed laser is pumped with a plurality of laser diodes, and the pump is terminated for all of the laser diodes of the plurality of laser diodes the pumping of the seed laser is discontinued by terminating pump pulses applied to the plurality of laser diodes.

11. The method of claim 10, further comprising initiating generation of the optical pulse by applying a pulse current to at least one of the plurality of laser diodes, wherein the pulse current is decreased in response to the detected seed laser optical pulse.

12. The method of claim 11, wherein the pulse current is greater than a laser diode threshold current for at least one of the plurality of laser diodes.

13. The method of claim 11, further comprising applying a bias current to at least one of the plurality of laser diodes, wherein the bias current is less than a pump laser threshold.

14. The method of claim 13, wherein the bias current is a DC bias current that is applied in response to termination of the pump pulse.

15. The method of claim 8, wherein the seed laser is a microchip laser that comprises a solid state gain medium.

16. The method of claim 8, further comprising controlling a seed laser temperature to within about 1 C.

17. The method of claim 8, further comprising selecting a temperature for the seed laser based on jitter associated with a plurality of optical pulses.

18. The method of claim 17, further comprising controlling a pump laser current to within about 100 mA.

19. An optical pulse source, comprising:
 a pump source configured to provide a pump beam;
 a solid state gain medium situated in an optical resonator and configured to be pumped by the pump beam; and
 a pump source controller configured to adjust the pump source so as to periodically establish a pump laser sequence at a repetition rate greater than $1/T_{gain}$ where $T_{gain}$ is a deca time associated with seed laser gain, the pump laser sequence comprising establishing an initial bias, applying a pulsed bias, and discontinuing the pulsed bias and reapplying the initial bias in response to detection of an optical pulse from the solid state gain medium, wherein the pump beam is discontinued so as to inhibit production of a subsequent seed laser optical pulse associated with the pump beam.

20. The optical pulse source of claim 19, further comprising a photodetector coupled to the pump source controller and configured to detect the optical pulse.

21. The optical pulse source of claim 19, wherein the pump source is a laser diode and the pump source controller is configured to establish the initial bias, apply a pulsed bias, and discontinue the pulsed bias based on respective currents applied to the laser diode.

22. The optical pulse source of claim 19, further comprising a pump source attenuator that discontinues the pulsed bias based on attenuation of a pump optical beam.

23. The optical pulse source of claim 19, further comprising a pump source attenuator that establishes the pulsed bias based on attenuation of a pump optical beam.

24. A method, comprising:
 establishing an initial pumping of a seed laser gain medium;
 applying a plurality of pump pulses to a pump laser that is coupled to the seed laser gain medium, wherein the plurality of pump pulses are applied at a high repetition rate such that excess gain is not substantially reduced by spontaneous decay between pump pulses; and
 reducing a maximum pulse duration of each pump pulse so as to prevent double pulsing in an optical pulse associated with a seed laser, wherein the reducing the maximum pulse duration comprises detecting the optical pulse associated with the seed laser, and in response to the detected optical pulse, terminating the pump pulse to allow optical gain in the seed laser gain medium to decrease sufficiently to inhibit production of a subsequent seed laser optical pulse associated with the pump pulse.

* * * * *